(12) United States Patent
Kim et al.

(10) Patent No.: US 9,312,857 B2
(45) Date of Patent: Apr. 12, 2016

(54) SEMICONDUCTOR CIRCUIT

(71) Applicant: Samsung Electronics Co., Ltd., Suwon-si (KR)

(72) Inventors: Min-Su Kim, Hwaseong-si (KR);
Jin-Seung Son, Austin, TX (US);
Prashant Kenkare, Austin, TX (US)

(73) Assignee: Samsung Electronics Co., Ltd. (KR)

( * ) Notice: Subject to any disclaimer, the term of this patent is extended or adjusted under 35 U.S.C. 154(b) by 53 days.

(21) Appl. No.: 14/208,053

(22) Filed: Mar. 13, 2014

(65) Prior Publication Data

US 2015/0263730 A1    Sep. 17, 2015

(51) Int. Cl.
*H03K 19/0185* (2006.01)
*H03K 19/00* (2006.01)
*H03K 19/003* (2006.01)

(52) U.S. Cl.
CPC ........ *H03K 19/0185* (2013.01); *H03K 19/0013* (2013.01); *H03K 19/00361* (2013.01)

(58) Field of Classification Search
CPC ....... H03K 3/00; H03K 3/037; H03K 3/0375; H03K 3/356017; H03K 3/356121; H03K 19/00; H03K 19/012; H03K 19/0013; H03K 19/0185; H03K 19/00361
USPC .......................................................... 327/208
See application file for complete search history.

(56) References Cited

U.S. PATENT DOCUMENTS

| | | | |
|---|---|---|---|
| 6,445,210 B2 | 9/2002 | Nojiri | |
| 7,924,080 B2 | 4/2011 | Uchino et al. | |
| 8,248,142 B1 | 8/2012 | Mokatren | |
| 2006/0226874 A1 | 10/2006 | Kim | |
| 2013/0182514 A1* | 7/2013 | Ge et al. | 365/189.11 |

FOREIGN PATENT DOCUMENTS

| | | |
|---|---|---|
| JP | 2001-102916 | 4/2001 |
| JP | 2006-157099 | 6/2006 |
| JP | 2010-178293 | 8/2010 |
| JP | 2013-012797 | 1/2013 |
| KR | 1020010063077 A | 7/2001 |
| KR | 1020010083282 A | 9/2001 |
| KR | 1020050079803 A | 8/2005 |

OTHER PUBLICATIONS

Hironobu et al., Level Shift Circuit, Dec. 8, 2010, translation of Patent Application Publication 2010-178293.*

* cited by examiner

*Primary Examiner* — John Poos
*Assistant Examiner* — David Mattison
(74) *Attorney, Agent, or Firm* — Myers Bigel & Sibley, P.A.

(57) ABSTRACT

A semiconductor circuit includes: a first circuit configured to provide first voltage to an output node when a voltage level of an input node is at a first level; a second circuit configured to provide second voltage to the output node when the voltage level of the input node is at a second level; and a third circuit configured to provide third voltage to the output node when the second voltage is provided to the output node, where the second circuit is turned off when the third voltage is provided to the output node.

17 Claims, 20 Drawing Sheets

1000

1100

1200

SEMICONDUCTOR CIRCUIT

TECHNICAL FIELD

The present invention relates to a semiconductor circuit.

BACKGROUND

With a trend in miniaturization of electronic apparatuses, semiconductor devices have also been miniaturized. As semiconductor devices are reduced in size, the impact of leakage currents that may be generated in these semiconductor devices has increased, which can negatively impact the power consumption of these semiconductor devices.

One technique for reducing leakage currents is to divide the semiconductor devices into a plurality of blocks and then apply different voltages to the respective blocks. In order to apply different voltages to the respective blocks from one voltage source, a circuit such as a level shifter is required.

SUMMARY

The present invention may provide a semiconductor circuits that have improved reliability.

The effects of the present invention are not limited to the aforementioned effects, and other effects, which are not mentioned above, will be apparently understood by the person skilled in the art from the recitations of the claims.

According to an aspect of the present invention, there is provided a semiconductor circuit comprising: a first circuit configured to provide a first voltage to an output node when a voltage level of an input node is at a first level; a second circuit configured to provide a second voltage to the output node when the voltage level of the input node is at a second level; and a third circuit configured to provide a third voltage to the output node when the second voltage is provided to the output node, where the second circuit is configured to not provide the second voltage to the output node when the third voltage is provided to the output node.

According to another aspect of the present invention, there is provided a semiconductor circuit comprising: an input node and an output node; a logic operation element having a first input that receives an inverted voltage level of the output node and a second input that receives the voltage level of the input node; a first transistor gated by one of the voltage level of the input node or the inverse of the voltage level of the input node to provide a first voltage to the output node; a second transistor gated by an output of the logic operation element to provide second voltage to the output node; a third transistor gated by one of the voltage level of the output node or the inverse of the voltage level of the output node to provide a third voltage to an intermediate node; and a fourth transistor gated by one of the voltage level of the input node or the inverse of the voltage level of the input node to provide the third voltage from the intermediate node to the output node.

BRIEF DESCRIPTION OF THE DRAWINGS

The above and other features and advantages of the present invention will become more apparent through the description of embodiments thereof that is provided below with reference to the attached drawings in which.

DETAILED DESCRIPTION OF THE EMBODIMENTS

Figure 1:
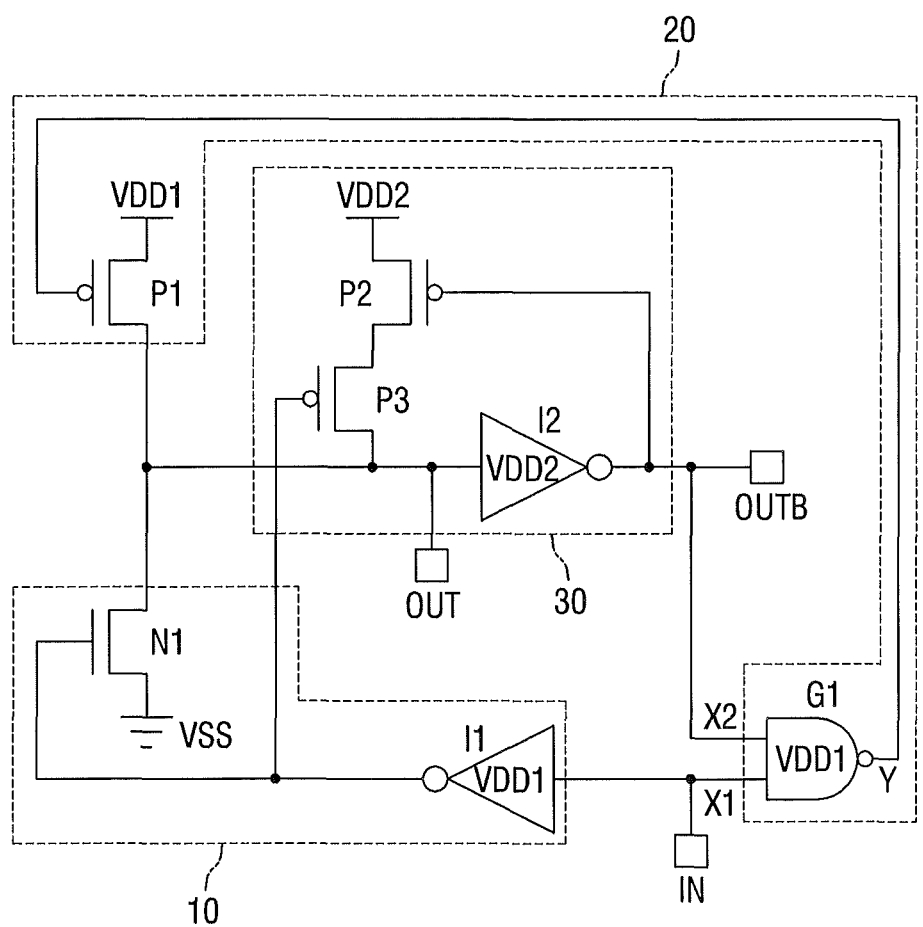
FIG. 1 is a circuit diagram of a semiconductor circuit according to an embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

It will be understood that when an element is referred to as being "on", "connected to" or "coupled to" another element, it can be directly on, connected or coupled to the other element or intervening elements may be present. In contrast, when an element is referred to as being "directly on", "directly connected to" or "directly coupled to" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present invention.

Unless otherwise defined, all terms (including technical and scientific terms) used herein have the same meaning as commonly understood by one of ordinary skill in the art to which the present invention belongs.

FIG. 1 is a circuit diagram of a semiconductor circuit 1 according to an embodiment of the present invention. Hereinafter, a case in which the semiconductor circuit according to embodiments of the present invention is a level shifter will be described as an example. However, the present invention is not limited thereto, and it will be appreciated that the semiconductor circuit 1 may be used for different or additional purposes, and may also be modified as appropriate.

As shown in FIG. 1, the semiconductor circuit 1 includes a first circuit 10, a second circuit 20, and a third circuit 30.

The first circuit 10 is configured so that when a first voltage level (for example, a low level) is input to an input node IN, the first circuit 10 is turned on to provide a first voltage VSS to an output node OUT. In the depicted embodiment, the first circuit 10 includes a first inverter I1 and a first NMOS transistor N1.

The first inverter I1 inverts the voltage level of the input node IN to provide the inverted voltage level to the first NMOS transistor N1. The first inverter I1 may be driven by a second voltage VDD1. The first NMOS transistor N1 is gated by an output of the first inverter I1 to selectively transfer the first voltage VSS to the output node OUT. Operation of the first circuit 10 will be described in more detail below.

The second circuit 20 is configured so that when a second voltage level (for example, a high level) is input to the input node IN, the second circuit 20 is turned on to provide the second voltage VDD1 to the output node OUT. The second circuit 20 is also configured to turn off when a third voltage VDD2 is provided to the output node OUT. In the depicted embodiment, the second circuit 20 includes a first PMOS transistor P1, and a first logic operation element G1.

The first PMOS transistor P1 is gated by an output of the first logic operation element G1 to selectively transfer the second voltage VDD1 to the output node OUT. In the depicted embodiment, the first logic operation element G1 is implemented as a NAND gate. The first logic operation element G1 may be driven by the second voltage VDD1. Operation of the second circuit 20 will be described in more detail below.

The third circuit 30 is configured so that when the second voltage VDD1 is provided to the output node OUT, the third circuit 30 turns on to provide the third voltage VDD2 to the output node OUT. In some embodiments of the present invention, an absolute value of a magnitude of the third voltage VDD2 may be larger than an absolute value of a magnitude of the second voltage VDD1. That is, for example, when both the second voltage VDD1 and the third voltage VDD2 are positive voltages, the third voltage VDD2 may be greater than the second voltage VDD1. It will be appreciated, however, that in other embodiments the magnitudes of the second voltage VDD1 and the third voltage VDD2 may be modified. For example, in another embodiment, the absolute value of the magnitude of the third voltage VDD2 and the absolute value of the magnitude of the second voltage VDD1 may be the same.

The third circuit 30 may include a second inverter I2, a second PMOS transistor P2, and a third PMOS transistor P3, as illustrated in FIG. 1.

The second inverter I2 inverts a voltage level of the output node OUT to provide the inverted voltage level to the gate of the second PMOS transistor P2 and to node OUTB. In the depicted embodiment, the second inverter I2 is driven by the third voltage VDD2. The second PMOS transistor P2 may be gated by the inverted voltage level of the output node OUT and the third PMOS transistor P3 may be gated by the voltage level of the output of the first inverter I1. The second PMOS transistor P2 and the third PMOS transistor P3 are connected in series between the third voltage VDD2 and the output node OUT.

In particular, the second PMOS transistor P2 is gated by an output of the second inverter I2, which is acquired by inverting the voltage level of the output node OUT. When turned on, the second PMOS transistor P2 transfers the third voltage VDD2 to the third PMOS transistor P3. The third PMOS transistor P3 is gated by an output of the first inverter I1, which is acquired by inverting the voltage level of the input node IN. When turned on, the third PMOS transistor P3 transfers the third voltage VDD2 received from the second PMOS transistor P2 to the output node OUT. Operation of the third circuit 30 will be described in more detail below.

Figure 2:
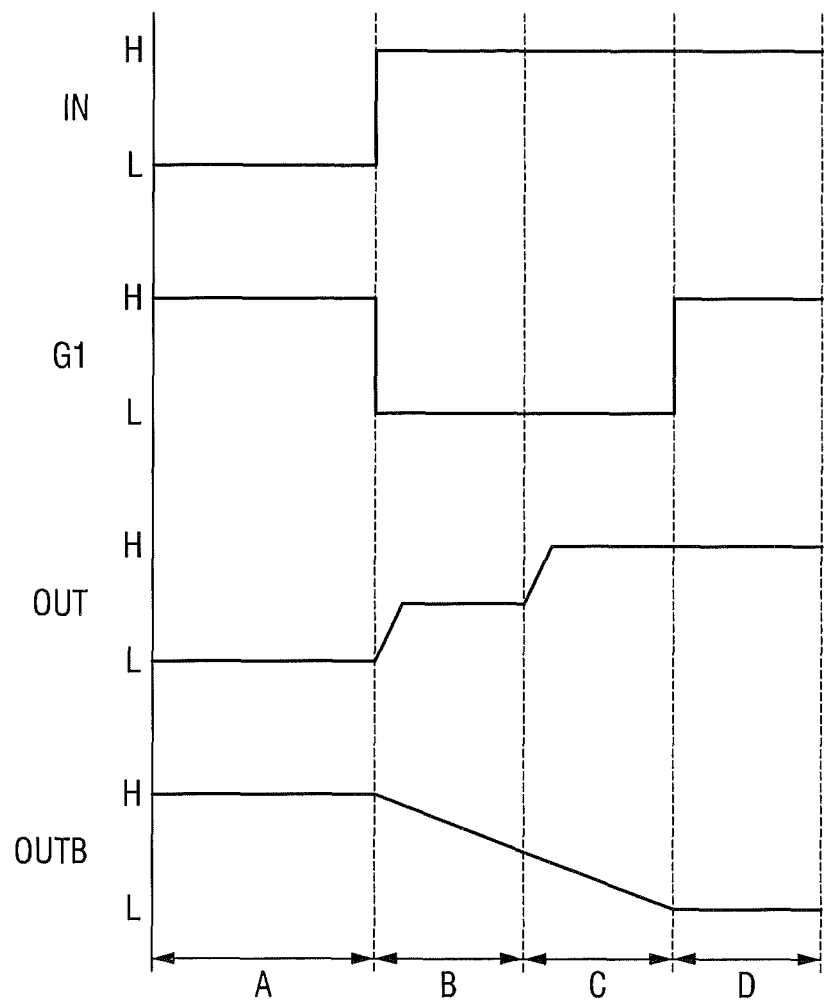
FIG. 2 is an operational timing diagram of the semiconductor circuit illustrated in FIG. 1.

Operation of the semiconductor circuit of FIG. 1 will now be described in greater detail with reference to FIGS. 2 to 6. FIG. 2 is an operational timing diagram of the semiconductor circuit of FIG. 1. FIGS. 3 to 6 are annotated versions of the circuit diagram of FIG. 1.

Figure 3:
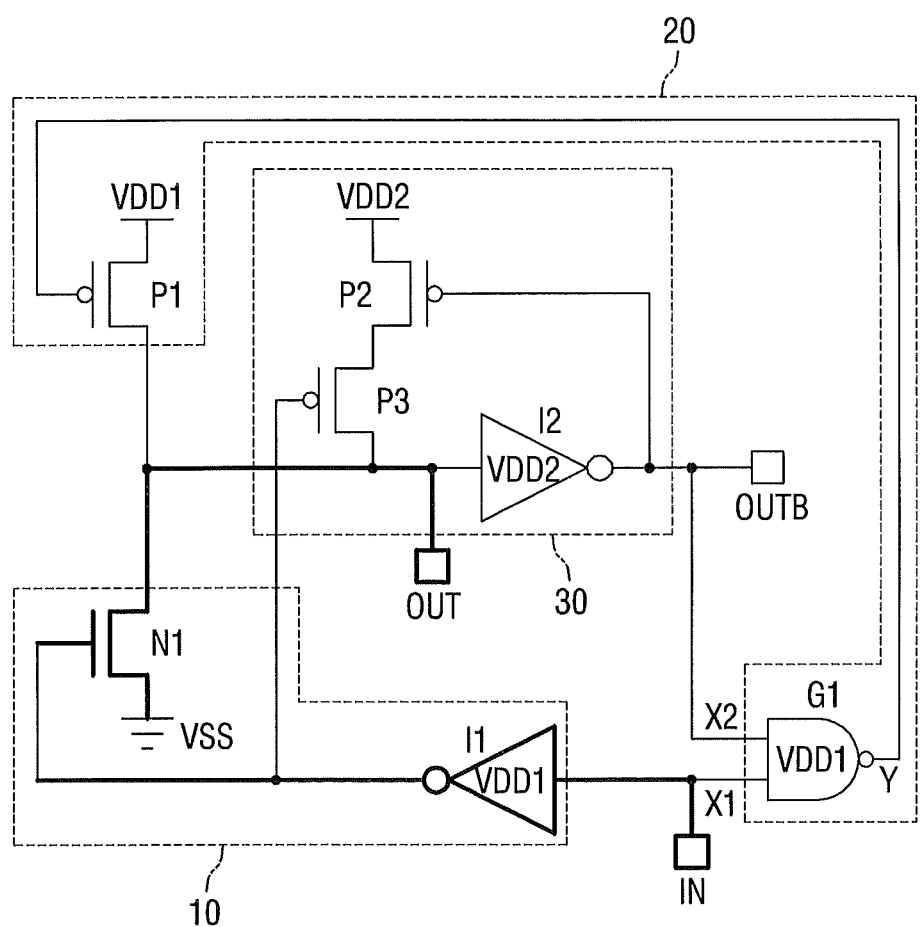
FIGS. 3 to 6 are circuit diagrams that illustrate operation of the semiconductor circuit of FIG. 1.

First, referring to FIGS. 2 and 3, a voltage level of the input node IN is at a low level in section A. Since the output of the first inverter I1 is at the high level in response to the low voltage level at the input node IN, the first NMOS transistor N1 is turned on. As a result, the first voltage VSS is provided by the first NMOS transistor N1 to the output node OUT so that the voltage level of the output node OUT transitions to the low level at the end of Section A as is illustrated in FIG. 2. In some embodiments of the present invention, the first voltage VSS may be, for example, ground voltage, but the present invention is not limited thereto.

Meanwhile, the relationships between the two inputs X1 and X2 and the output Y of the first logic operation element G1 are shown in <Table 1> below. As is readily apparent from <Table 1>, the first logic operation element G1 is a NAND gate. In <Table 1> and the discussion that follows, "L" represents that the input or output is at the low level and "H" represents that the input or output is at the high level.

TABLE 1

| X1 | X2 | Y |
|---|---|---|
| L | L | H |
| H | L | H |
| L | H | H |
| H | H | L |

As illustrated in FIG. 3, the voltage level of the input node IN is input as the first input X1 of the first logic operation element G1 and an inverted voltage level of the output node OUT (that is, a voltage level of a node OUTB) is input as the second input X2. In section A of FIG. 2, since the voltage level of the input node IN is at the low level, with reference to <Table 1>, the output of the first logic operation element G1 is at the high level, as is illustrated in FIG. 2. Therefore, the first PMOS transistor P1, which is gated by the output of the first logic operation element G1, is turned off. In other words, the second circuit 20 is turned off. As a result, the second voltage VDD1 is not provided to the output node OUT, and hence the output node OUT is maintained at the low level by first voltage VSS and the node OUTB is maintained at the high level by the second inverter I2.

Figure 4:
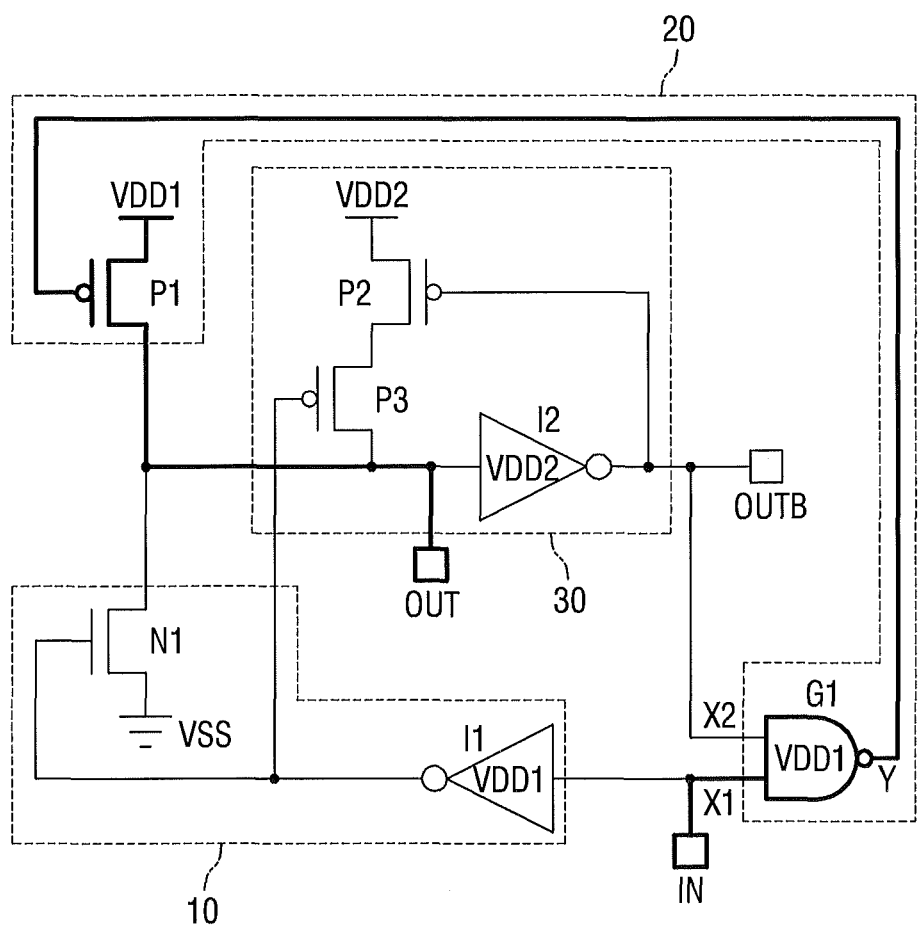

Next, referring to FIGS. 2 and 4, in Section B, the voltage level of the input node IN transitions from the low level to the high level. Since the output of the first inverter I1 is at the low level, the first NMOS transistor N1 is turned off. That is, the first circuit 10 is turned off. As a result, the first voltage VSS is no longer provided to the output node OUT.

Meanwhile, as the voltage level of the input node IN changes from the low level to the high level, the first input X1 of the first logic operation element G1 is changed to the high level. Once this occurs, both the first input X1 and the second input X2 of the first logic operation element G1 are at the high level, and thus the output of the first logic operation element G1 transitions to the low level as illustrated in FIG. 2 according to <Table 1> above. Therefore, the first PMOS transistor P1, which is gated by the output of the first logic operation element G1, is turned on. In other words, the second circuit 20 is turned on.

When the second circuit 20 is turned on as described above, the second voltage VDD1 is provided to the output node OUT, and as a result, the voltage level of the output node OUT increases and the voltage level of the node OUTB decreases, as illustrated in FIG. 2.

When the output of the first inverter I1 transitions to the low level in response to the voltage level of the input node IN transitioning to the high level, the third PMOS transistor P3 that is included in the third circuit 30 is turned on. However, in this case, the voltage level of the node OUTB does not decrease all the way to the low level, and thus the second PMOS transistor P2 is not turned on. Consequently, the third voltage VDD2 is not provided to the output node OUT.

Figure 5:
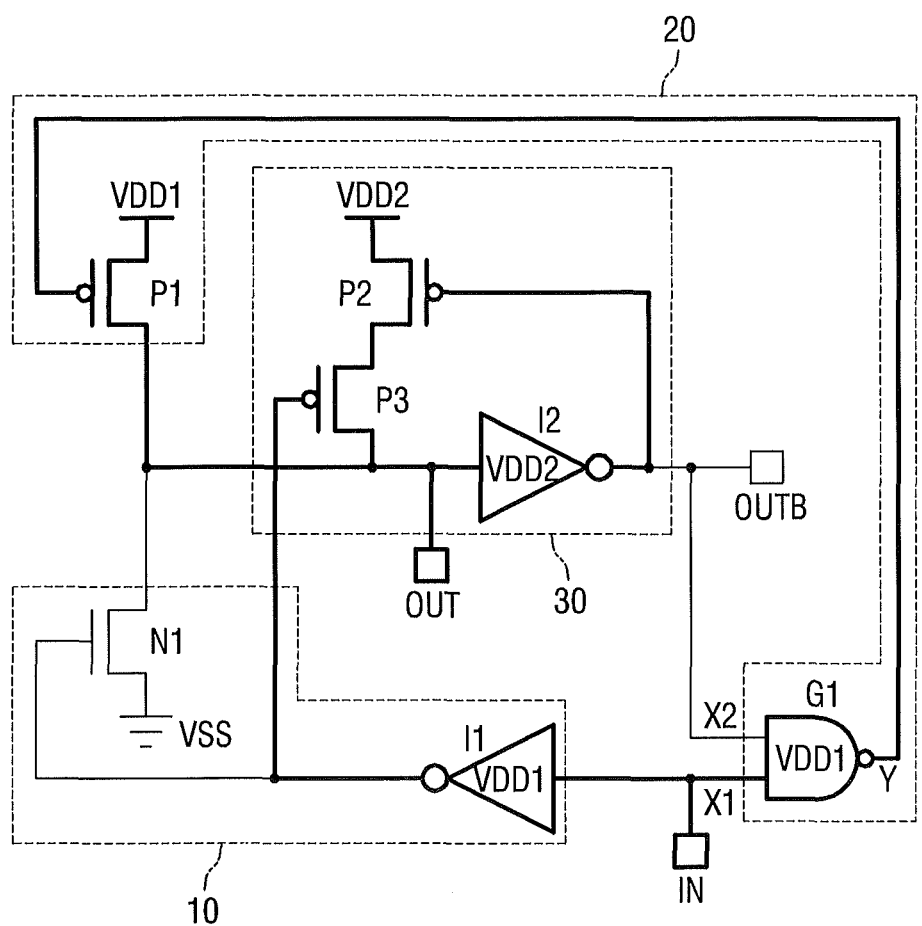

Referring next to FIGS. 2 and 5, it can be seen that in section C (see FIG. 2) the voltage level of the node OUTB eventually decreases to the low level, which causes the second PMOS transistor P2 to turn on. Therefore, the third voltage VDD2, which may be higher than the second voltage VDD1, is provided to the output node OUT, and as a result, the voltage of the output node OUT increases further.

Meanwhile, in section C of FIG. 2, since the output of the first logic operation element G1 is maintained at the low level, the first PMOS transistor P1 is still turned on as illustrated in FIG. 5. In other words, the second circuit 20 is turned on.

Figure 6:
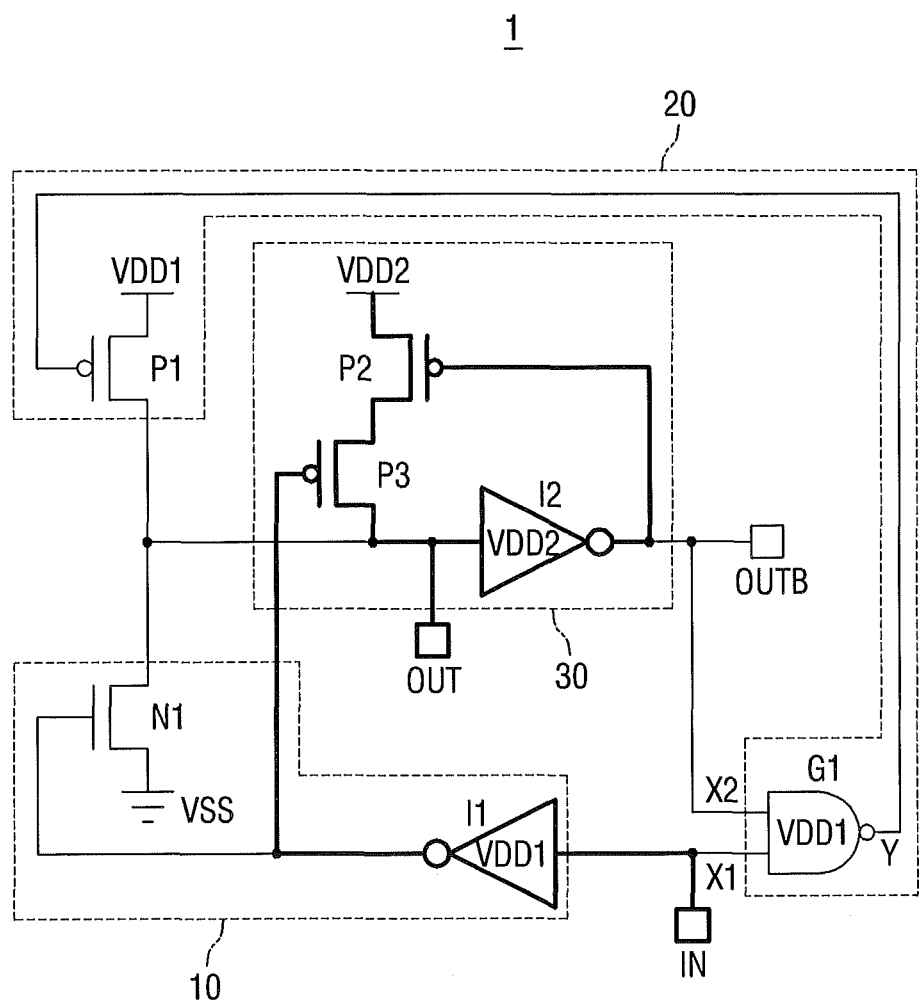

Next, referring to FIGS. 2 and 6, in section D, as the second input X2 of the first logic operation element G1 reaches the low level, the output of the first logic operation element G1 transitions to the high level according to <Table 1> above. Therefore, the first PMOS transistor P1, which is gated by the output of the first logic operation element G1, is turned off. In other words, the second circuit 20 is turned off. As a result, until the voltage level of the input node IN is again changed to the low level, the third voltage VDD2 is continuously provided to the output node OUT as illustrated in FIG. 6.

As described above, in the semiconductor circuit 1 of FIG. 1, the inputs X1 and X2 of the first logic operation element G1 are set according to the voltage levels of the input node IN and the node OUTB. Accordingly, the output of the first logic operation element G1—which is used to turn off the second circuit 20—is set based on the voltage levels of the input node IN and the node OUTB. As a result, the third voltage VDD2 is provided by the third circuit 30 to the output node OUT, and the second circuit 20 is turned off only when the voltage level of the node OUTB decreases sufficiently.

In contrast, if the second circuit 20 is turned off before the third voltage VDD2 is provided to the output node OUT, the second PMOS transistor P2 cannot be turned on at the voltage level of the output node OUT, and as a result, the voltage level of the output node OUT may decrease. In other words, while the voltage level of the input node IN is maintained at the high level, the voltage level of the output node OUT may not be maintained at the high level. When such a phenomenon occurs, operational reliability of the semiconductor circuit 1 may deteriorate. However, in the semiconductor circuit 1 this problem may be reduced or prevented through the configuration described above.

Further, in the semiconductor circuit 1 according to the embodiment of FIG. 1, the third PMOS transistor P3 that is included in the third circuit 30 is gated by the inverted voltage level of the input node IN. Therefore, when the voltage level of the input node IN is at the high level, the third PMOS transistor P3 is continuously turned on. Therefore, the third voltage VDD2 may be provided to the output node OUT with reliability without an influence of external variables once the second PMOS transistor P2 is turned on.

Through the above-described configuration and operation, operational reliability of the semiconductor circuit 1 according to the embodiment may be improved and product reliability of a product adopting the semiconductor circuit 1 may also be improved.

Hereinafter, referring to FIG. 7, a semiconductor circuit 2 according to another embodiment of the present invention will be described. The semiconductor circuit 2 includes a fourth circuit 12, a fifth circuit 22, and a sixth circuit 32.

The fourth circuit 12 is turned on to provide a fourth voltage VDD to the output node OUT when the voltage level of the input node IN is at a first level (for example, a high level). In the embodiment of FIG. 7, the fourth circuit 12 may include a third inverter I3 and a fourth PMOS transistor P4.

The third inverter I3 inverts the voltage level of the input node IN and provides the inverted voltage level to the fourth PMOS transistor P4. The fourth PMOS transistor P4 is gated by the output of the third inverter I3 to transfer the fourth voltage VDD to the output node OUT. Operation of the fourth circuit 12 will be described in more detail below.

The fifth circuit 22 is turned on to provide a fifth voltage VSS1 to the output node OUT when the voltage level of the input node IN is at a second level (for example, a low level). The fifth circuit 22 may be turned off when a sixth voltage VSS2 is provided to the output node OUT.

Figure 7:
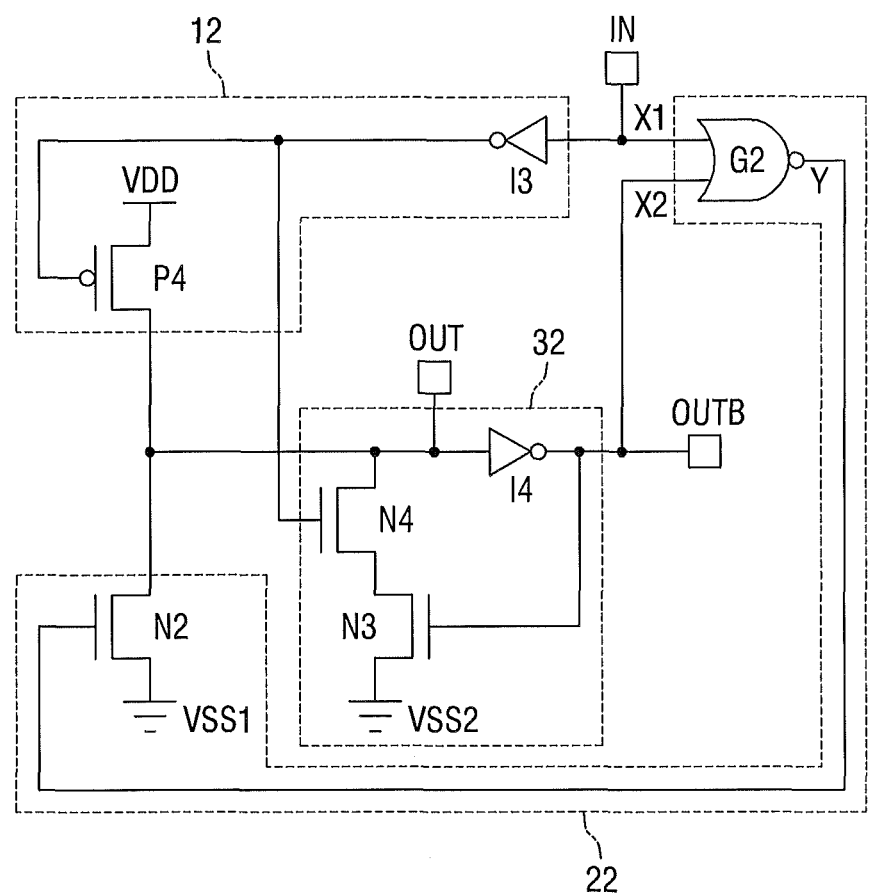
FIG. 7 is a circuit diagram of a semiconductor circuit according to another embodiment of the present invention.

In the embodiment of FIG. 7, the fifth circuit 22 may include a second NMOS transistor N2, and a second logic operation element G2 that logically operates on an inverted voltage level of the output node OUT and the voltage level of the input node IN.

The second NMOS transistor N2 is gated by an output of the second logic operation element G2 to transfer the fifth voltage VSS1 to the output node OUT. The second logic operation element G2 may be implemented as a NOR gate, as illustrated in FIG. 7. Operation of the fifth circuit 22 will be described in more detail below.

The sixth circuit 32 is turned on to provide the sixth voltage VSS2 to the output node OUT in response to the fifth voltage VSS1 being provided to the output node OUT. In some embodiments, an absolute value of a magnitude of the sixth voltage VSS2 may be larger than an absolute value of a magnitude of the fifth voltage VSS1. That is, for example, when both the fifth voltage VSS1 and the sixth voltage VSS2 are negative voltages, the sixth voltage VSS2 may be lower than the fifth voltage VSS1.

It will be appreciated, however, that in other embodiments the magnitudes of the fifth voltage VSS1 and the sixth voltage VSS2 may be modified. For example, in further embodiments of the present invention, the fifth voltage VSS1 and the sixth voltage VSS2 may be set so that the absolute value of the magnitude of the fifth voltage VSS1 and the absolute value of the magnitude of the sixth voltage VSS2 are equal to each other.

The sixth circuit 32 may include a fourth inverter I4, a third NMOS transistor N3, and a fourth NMOS transistor N4 as illustrated in FIG. 7.

The fourth inverter I4 inverts the voltage level of the output node OUT to provide the inverted voltage level to the gate of the third NMOS transistor N3. The fourth NMOS transistor N4 may be gated by the inverted voltage level of the input node IN. The third NMOS transistor N3 and the fourth NMOS transistor N4 may be connected in series between the sixth voltage VSS2 and the output node OUT.

In more detail, the third NMOS transistor N3 is gated by the output of the fourth inverter I4, which output is acquired by inverting the voltage level of the output node OUT, When turned on, the third NMOS transistor N3 transfers the sixth voltage VSS2 to the fourth NMOS transistor N4. The fourth NMOS transistor N4 is gated by an output of the third inverter I3 that inverts the voltage level of the input node IN. The fourth NMOS transistor N4 transfers the sixth voltage VSS2 received from the third NMOS transistor N3 to the output node OUT. Operation of the sixth circuit 32 will be described in more detail below.

Hereinafter, operation of the semiconductor circuit 2 of FIG. 7 will be described with reference to FIGS. 8 to 12.

Figure 8:
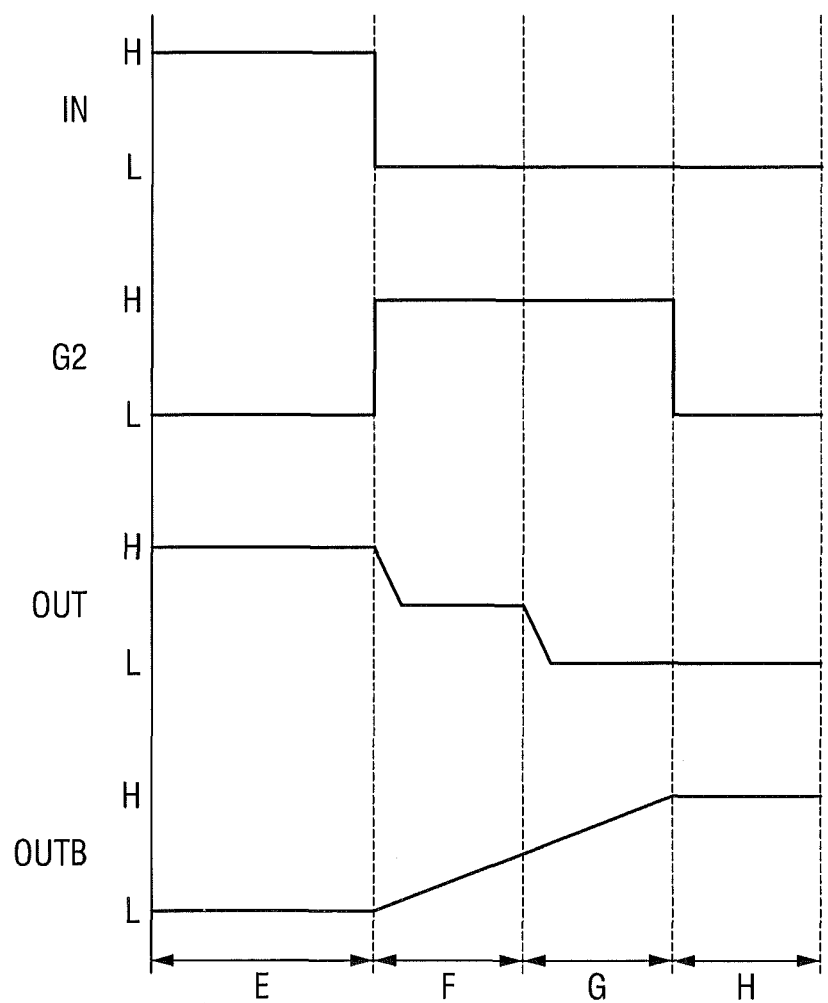
FIG. 8 is an operational timing diagram of the semiconductor circuit illustrated in FIG. 7.

FIG. 8 is an operational timing diagram of the semiconductor circuit 2 of FIG. 7. FIGS. 9 to 12 are annotated versions of the circuit diagram of FIG. 7.

Figure 9:
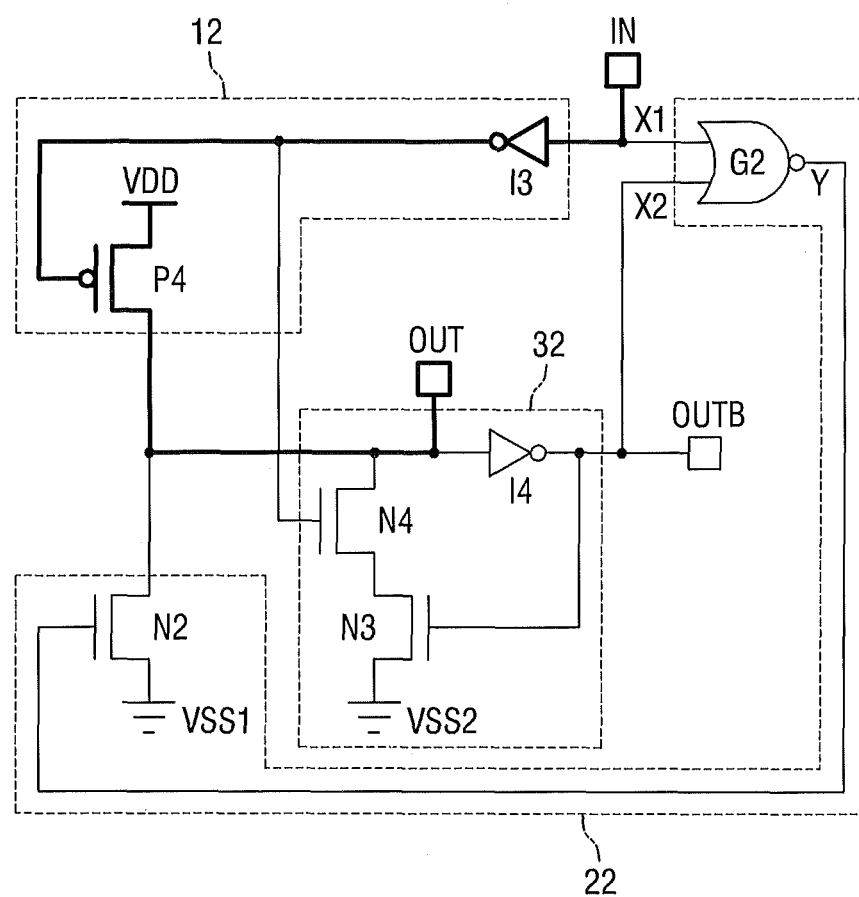
FIGS. 9 to 12 are circuit diagrams that illustrate operation of the semiconductor circuit of FIG. 7.

Referring to FIGS. 8 and 9, a voltage level of the input node IN is at a high level in Section E. Since an output of the third inverter I3 is at the low level in Section E, the fourth PMOS transistor P4 is turned on. As a result, the fourth voltage VDD is provided to the output node OUT, so that the voltage level of the output node OUT is at the high level in Section E, as illustrated in FIG. 8. In some embodiments of the present invention, the fourth voltage VDD may be, for example, a positive voltage, but the present invention is not limited thereto.

Meanwhile, the relationships between the two inputs X1 and X2 and the output Y of the second logic operation element G2 formed by a NOR gate are shown in <Table 2> below.

TABLE 2

| X1 | X2 | Y |
|----|----|---|
| L | L | H |
| H | L | L |
| L | H | L |
| H | H | L |

As illustrated in FIG. 9, the voltage level of the input node IN is input as the first input X1 of the second logic operation element G2 and an inverted voltage level of the output node OUT (that is, a voltage level of a node OUTB) is input as the second input X2. In section E of FIG. 8, since the voltage level of the input node IN is at the high level and the voltage level of the node OUTB is at the low level, the output of the second logic operation element G2 is at the low level as illustrated in FIG. 8 when referring to <Table 2> above.

Therefore, the second NMOS transistor N2 that is gated by the output of the second logic operation element G2 is turned off. In other words, the fifth circuit 22 is turned off. As a result, the fifth voltage VSS1 is not provided to the output node OUT, and the output node OUT is therefore maintained at the high level by the fourth voltage VDD and the node OUTB is maintained at the low level by the fourth inverter I4.

Figure 10:
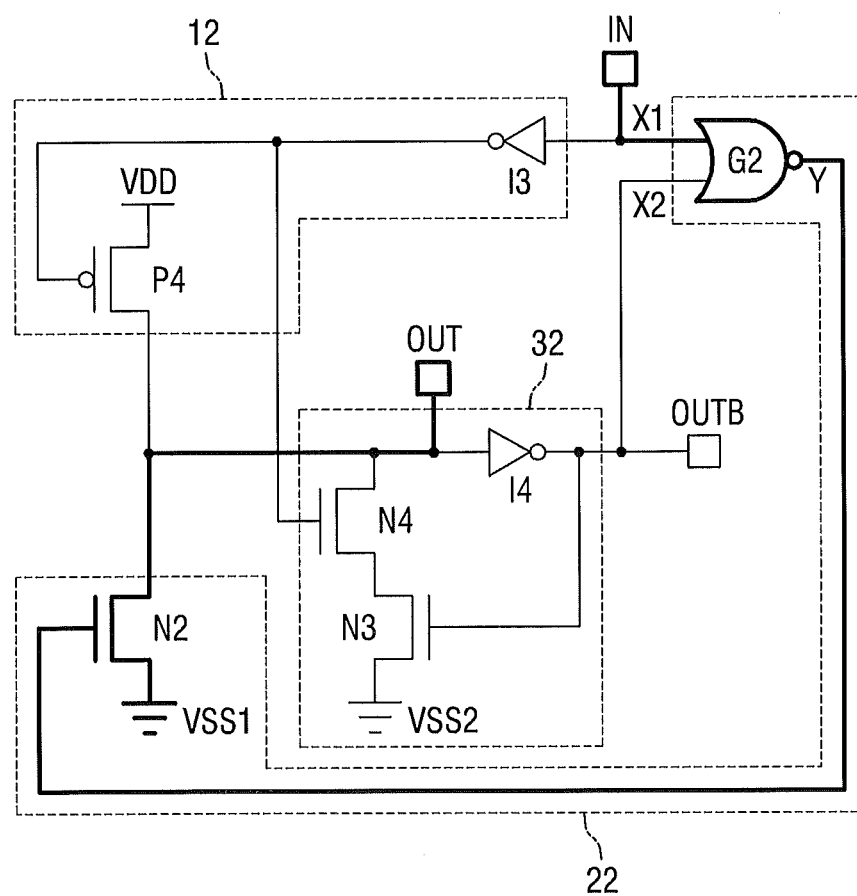

Next, referring to FIGS. 8 and 10, the voltage level of the input node IN transitions from the high level to the low level at the beginning of section F. Therefore, since the output of the third inverter I3 is at the high level, the fourth PMOS transistor P4 is turned off. That is, the fourth circuit 12 is turned off. As a result, the fourth voltage VDD is no longer provided to the output node OUT.

As the voltage level of the input node IN transitions from the high level to the low level, the first input X1 of the second logic operation element G2 is changed to the low level. Since the second input X2 of the second logic operation element G2 is also at the low level, the output of the second logic operation element G2 transitions to the high level as illustrated in FIG. 8 according to <Table 2> above. Therefore, the second NMOS transistor N2 that is gated by the output of the second logic operation element G2 is turned on. In other words, the fifth circuit 22 is turned on.

When the fifth circuit 22 is turned on as described above, the fifth voltage VSS1 is provided to the output node OUT, and as a result, the voltage level of the output node OUT decreases and the voltage level of the node OUTB increases, as illustrated in FIG. 8.

Meanwhile, as the output of the third inverter I3 transitions to the high level, the fourth NMOS transistor N4 included in the sixth circuit 32 is turned on. However, in this case, the voltage level of the node OUTB does not increase sufficiently and thus the third NMOS transistor N3 is not turned on, and as a result, the sixth voltage VSS2 is not provided to the output node OUT.

Figure 11:
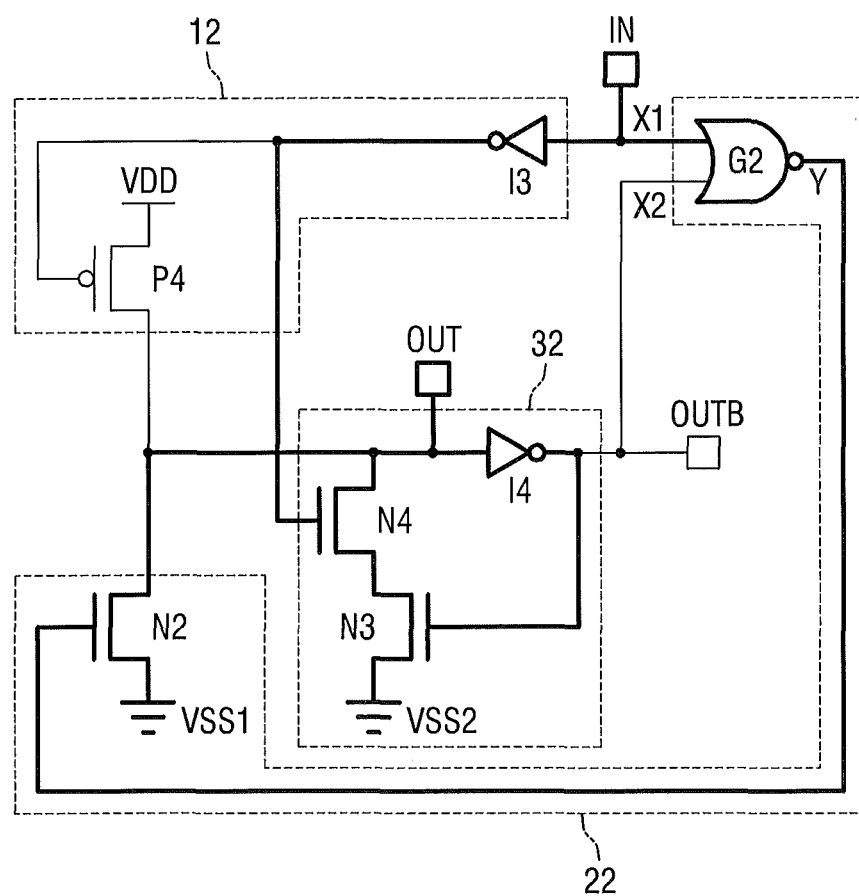

Next, referring to FIGS. 8 and 11, when the voltage level of the node OUTB increases to the high level, the third NMOS transistor N3 is turned on, as shown in section G of FIG. 8. Therefore, the sixth voltage VSS2 (herein, the sixth voltage VSS2 may be negative voltage which has a larger absolute value than the fifth voltage VSS1, that is, when the fifth voltage VSS1 is, for example, −1.5 V, the sixth voltage VSS2 may be −3 V) which is lower than the fifth voltage VSS1, is provided to the output node OUT, and as a result, the voltage of the output node OUT decreases further.

Meanwhile, in section G of FIG. 8, since the output of the second logic operation element G2 is maintained at the high level, the second NMOS transistor N2 is still turned on, as illustrated in FIG. 11. In other words, the fifth circuit 22 remains turned on.

Figure 12:
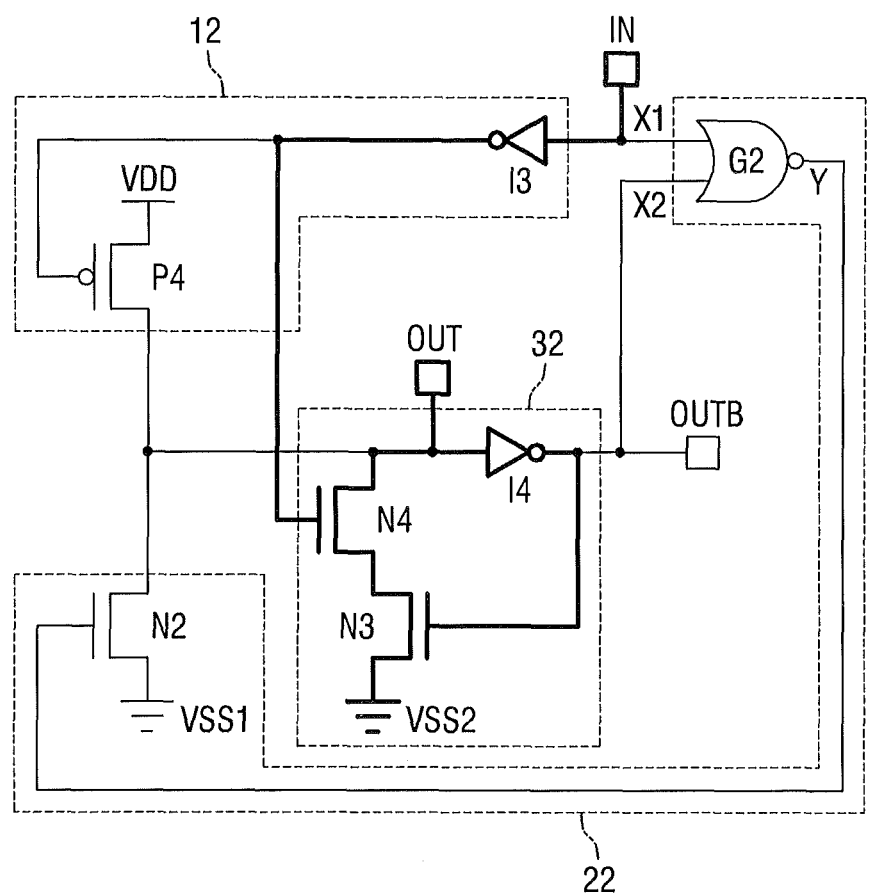

Next, referring to FIGS. 8 and 12, in section H, as the second input X2 of the second logic operation element G2 reaches the high level, the output of the second logic operation element G2 is changed to the low level according to <Table 2> above. Therefore, the second NMOS transistor N2 that is gated by the output of the second logic operation element G2 is turned off. In other words, the fifth circuit 22 is turned off. As a result, until the voltage level of the input node IN is again changed to the high level, the sixth voltage VSS2 is continuously provided to the output node OUT, as illustrated in FIG. 12.

As described above, in the semiconductor circuit 2 of FIG. 7, the inputs X1 and X2 of the second logic operation element G2 are set according to the voltage levels of the input node IN and the node OUTB. Accordingly, the output of the second logic operation element G2—which is used to turn off the fifth circuit 22—are set based on the voltage levels of the input node IN and the node OUTB. As a result, the sixth voltage VSS2 is provided by the sixth circuit 32 to the output node OUT, and the fifth circuit 22 is turned off only when the voltage level of the node OUTB increases sufficiently.

In contrast, if the fifth circuit 22 is turned off before the sixth voltage VSS2 is provided to the output node OUT, the third NMOS transistor N3 cannot be turned on at the voltage level of the output node OUT, and as a result, the voltage level of the output node OUT may increase. In other words, while the voltage level of the input node IN is maintained at the low level, the voltage level of the output node OUT may not be maintained at the low level. When such a phenomenon occurs, the operational reliability of the semiconductor circuit 2 may deteriorate. However, in the semiconductor circuit 2 this problem may be reduced and/or prevented through the configuration described above.

In the semiconductor circuit 2 of FIG. 12, the fourth NMOS transistor N4 that is included in the sixth circuit 32 is gated by the inverted voltage level of the input node IN. Therefore, while the voltage level of the input node IN is at the low level, the fourth NMOS transistor N4 may be continuously turned on. Consequently, the sixth voltage VSS2 may be reliably provided to the output node OUT without the influence of external variables when the third NMOS transistor N3 is turned on.

Through such a configuration and operational reliability of the semiconductor circuit 2 may be secured and furthermore, product reliability of a product adopting the semiconductor circuit 2 may also be improved.

Hereinafter, a semiconductor circuit 3 according to yet another embodiment of the present invention will be described with reference to FIG. 13.

Figure 13:
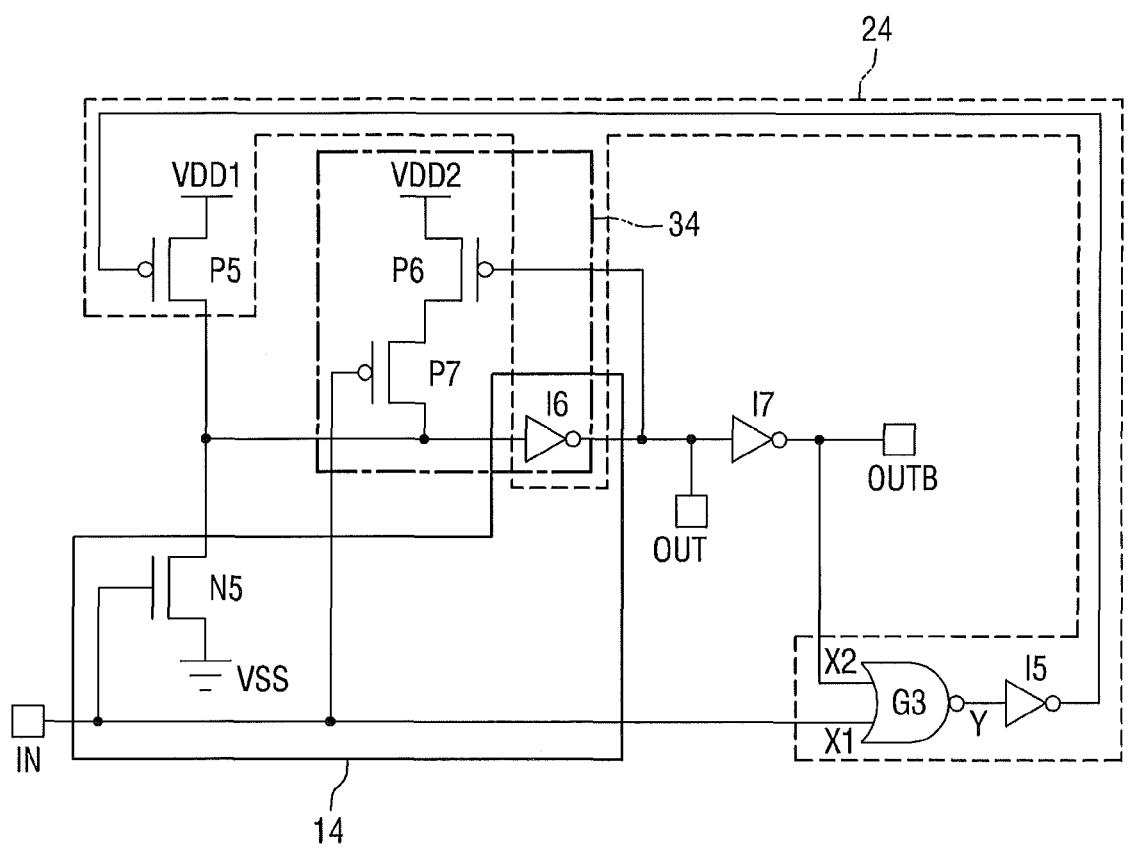
FIG. 13 is a circuit diagram of a semiconductor circuit according to yet another embodiment of the present invention.

Referring to FIG. 13, the semiconductor circuit 3 includes a seventh circuit 14, an eighth circuit 24, and a ninth circuit 34.

The seventh circuit 14 is turned on to provide the inverse of a first voltage VSS to the output node OUT when the voltage level of the input node IN is a first level (for example, a high level). The seventh circuit 14 may include a sixth inverter I6 and a fifth NMOS transistor N5, as illustrated in FIG. 13.

The fifth NMOS transistor N5 is gated by the voltage level of the input node IN. When turned on, the fifth NMOS transistor N5 transfers the first voltage VSS to the sixth inverter I6. The sixth inverter I6 inverts an output of the fifth NMOS transistor N5 and provides the inverted output to the output node OUT. Operation of the seventh circuit 14 will be described in more detail below.

The eighth circuit 24 is turned on to provide the inverse of the second voltage VDD1 to the output node OUT when the voltage level of the input node IN is at a second level (for example, a low level). The eighth circuit 24 may be turned off when the inverse of a third voltage VDD2 is provided to the output node OUT. The eighth circuit 24 may include a fifth PMOS transistor P5, the sixth inverter I6, a third logic operation element G3, and a fifth inverter I5, as illustrated in FIG. 13.

The fifth PMOS transistor P5 is gated by an output of the third logic operation element G3 inverted by the fifth inverter I5. When turned on, the fifth PMOS transistor P5 transfers the second voltage VDD1 to the sixth inverter I6. The sixth inverter I6 inverts the output of the fifth PMOS transistor P5 to transfer the inverted output to the output node OUT. The third logic operation element G3 may logically operate on the inverted voltage level of the output node OUT and the voltage level of the input node IN. In the depicted embodiment, the third logic operation element G3 may be implemented as a NOR gate, as illustrated in FIG. 13. The fifth inverter I5 may invert the output of the third logic operation element G3. Operation of the eighth circuit 24 will be described in more detail below.

The ninth circuit 34 is turned on to provide the inverse of the third voltage VDD2 to the output node OUT in response to the inverse of the second voltage VDD1 being provided to the output node OUT. In some embodiments, an absolute value of a magnitude of the third voltage VDD2 may be larger than an absolute value of a magnitude of the second voltage VDD1. That is, for example, when both the second voltage VDD1 and the third voltage VDD2 are positive voltages, the third voltage VDD2 may be higher than the second voltage VDD1. It will be appreciated, however, that in other embodiments the magnitudes of the second voltage VDD1 and the third voltage VDD2 may be modified. For example, in some embodiments, the third voltage VDD2 and the second voltage VDD1 may be set so that the absolute value of the magnitude of the third voltage VDD2 and the absolute value of the magnitude of the second voltage VDD1 are the same.

The ninth circuit 34 may include the sixth inverter I6, a sixth PMOS transistor P6, and a seventh PMOS transistor P7 as illustrated in FIG. 13.

The sixth inverter I6 inverts an output of the fifth PMOS transistor P5 to provide the inverted output to the gate of the sixth PMOS transistor P6. The seventh PMOS transistor P7 may be gated by the voltage level of the input node IN. The sixth PMOS transistor P6 and the seventh PMOS transistor P7 may be connected in series between the third voltage VDD2 and the input to the inverter I6.

In more detail, the sixth PMOS transistor P6 is gated by the voltage level of the output node OUT to transfer the third voltage VDD2 to the seventh PMOS transistor P7. The seventh PMOS transistor P7 is gated by the voltage level of the input node IN to provide the third voltage VDD2 received from the sixth PMOS transistor P6 to the input of the sixth inverter I6. The sixth inverter I6 inverts an output of the seventh PMOS transistor P7 to transfer the inverted output to the output node OUT. Operation of the ninth circuit 34 will be described in more detail below.

Operation of the semiconductor circuit 3 of FIG. 13 will now be described with reference to FIG. 14, which is a timing diagram illustrating operation of the semiconductor circuit 3.

Figure 14:
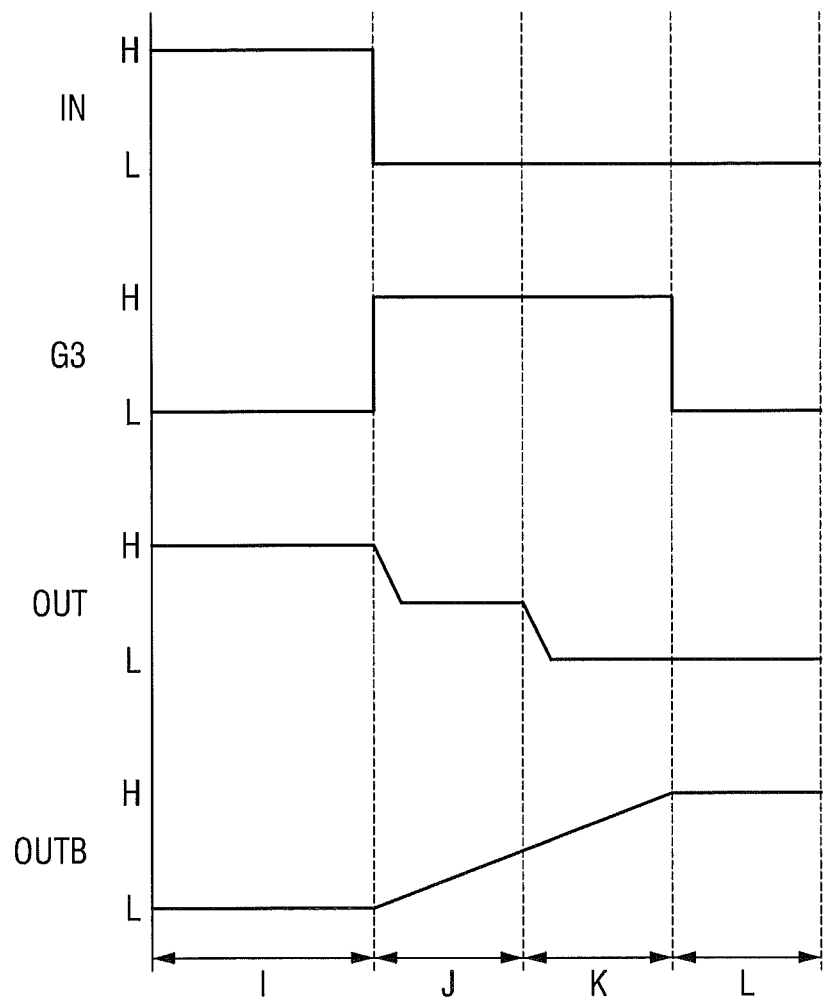
FIG. 14 is an operational timing diagram of the semiconductor circuit illustrated in FIG. 13.

Referring to FIG. 14, when a voltage level of the input node IN is at a high level (Section I), the fifth NMOS transistor N5 is turned on. The fifth NMOS transistor N5, when turned on, supplies the first voltage VSS to the sixth inverter I6, and the sixth inverter I6 inverts the first voltage VSS to provide the inverted voltage to the output node OUT. Therefore, the voltage level of the output node OUT is at a high level in Section I as illustrated in FIG. 14. In some embodiments of the present invention, the first voltage VSS may be, for example, ground voltage, but the present invention is not limited thereto.

Meanwhile, the relationships between the inputs X1 and X2, and the output Y of the third logic operation element G3 formed by the NOR gate are the same as described in <Table 2> above.

As illustrated in FIG. 13, the voltage level of the input node IN is input as the first input X1 of the third logic operation element G3 and an inverted voltage level of the output node OUT (that is, a voltage level of a node OUTB) is input as the second input X2. In section I of FIG. 14, since the voltage level of the input node IN is at the high level, the output of the third logic operation element G3 is at the low level as illustrated in FIG. 14 with reference to <Table 2> above. The fifth inverter I5 may invert the output of the third logic operation element G3 to provide the inverted output to the fifth PMOS transistor P5. Therefore, the fifth PMOS transistor P5, which is gated by the output of the fifth inverter I5, is turned off. In other words, the eighth circuit 24 is turned off. As a result, the second voltage VDD1 is not provided to the sixth inverter I6, and hence the input to the sixth inverter is maintained at the low level by first voltage VSS, the output node OUT is maintained at the high level by the inverter I6, and the node OUTB is maintained at the low level by the seventh inverter I7.

Next, in section J of FIG. 14, the voltage level of the input node IN transitions from the high level to the low level. Therefore, the fifth NMOS transistor N5 is turned off. That is, the seventh circuit 14 is turned off. As such, the first voltage VSS is no longer provided to the output node OUT.

When the voltage level of the input node IN transitions from the high level to the low level, the first input X1 of the third logic operation element G3 transitions to the low level. Since both the first input X1 and the second input X2 of the third logic operation element G3 are at the low level, the output of the third logic operation element G3 transitions to the high level as illustrated in FIG. 14 according to <Table 2> above. The fifth inverter I5 may invert the output of the third logic operation element G3 to provide the inverted output to the fifth PMOS transistor P5. Therefore, the fifth PMOS transistor P5, which is gated by the output of the fifth inverter I5, is turned on. In other words, the eighth circuit 24 is turned on.

When the eighth circuit 24 is turned on, the second voltage VDD1 is provided to the sixth inverter I6 and the sixth inverter I6 inverts the second voltage VDD1 to transfer the inverted voltage to the output node OUT. Therefore, the voltage level of the output node OUT decreases as illustrated in FIG. 14 and the voltage level of the node OUTB increases as illustrated in the figure.

Additionally, when the voltage level of the input node IN transitions to the low level at the end of Section I, the seventh PMOS transistor P7 that is included in the ninth circuit 34 is turned on. However, since the voltage level of the output node OUT does not decrease sufficiently, the sixth PMOS transistor P6 is not turned on and, as a result, the third voltage VDD2 is not provided to the output node OUT.

Next, in section K of FIG. 14, when the voltage level of the output node OUT decreases sufficiently, the sixth PMOS transistor P6 is turned on. Therefore, the third voltage VDD2, which is higher than the second voltage VDD1, is provided to the sixth inverter I6. In addition, the sixth inverter I6 inverts the third voltage VDD2 to transfer the inverted voltage to the output node OUT. Therefore, the voltage level of the output node OUT further decreases and the voltage level of the node OUTB further increases as illustrated in FIG. 14.

Meanwhile, in section K of FIG. 14, since the output of the third logic operation element G3 is maintained at the high level, the fifth PMOS transistor P5 is still turned on. In other words, the eighth circuit 24 is turned on.

Next, in section L of FIG. 14, as the second input X2 of the third logic operation element G3 transitions to the high level, the output of the third logic operation element G3 is changed to the low level according to <Table 2> above. The fifth inverter I5 may invert the output of the third logic operation element G3 to provide the inverted output to the fifth PMOS transistor P5. Therefore, the fifth PMOS transistor P5, which is gated by the output of the fifth inverter I5, is turned off. In other words, the eighth circuit 24 is turned off. As a result, until the voltage level of the input node IN again transitions to the high level, the third voltage VDD2 is continuously provided to the inverter I6 which inverts the third voltage VDD2 so that the output node OUT remains at the low level.

In the semiconductor circuit 3 described above, the third voltage VDD2 is provided by the ninth circuit 34 to the inverter I6 which supplies the inverted third voltage VDD2 to the output node OUT. As a result, the eighth circuit 24 is turned off only when the voltage level of the node OUTB increases sufficiently, as in the embodiments described above. In addition, while the voltage level of the input node IN is at the low level, the seventh PMOS transistor P7 is continuously turned on. Therefore, the third voltage VDD2 may be provided to the output node OUT with reliability without an influence of external variables from the time when the sixth PMOS transistor P6 is turned on.

Consequently, while the voltage level of the input node IN is maintained at the low level, the voltage level of the output node OUT may also be maintained to the low level with reliability, thereby improving the operational reliability of the semiconductor circuit 3.

Hereinafter, a semiconductor circuit 4 according to still another embodiment of the present invention will be described with reference to FIG. 15. The description of the semiconductor circuit 4 that follows will omit description of elements and the operation thereof that have already been described above with reference to other embodiments.

Figure 15:
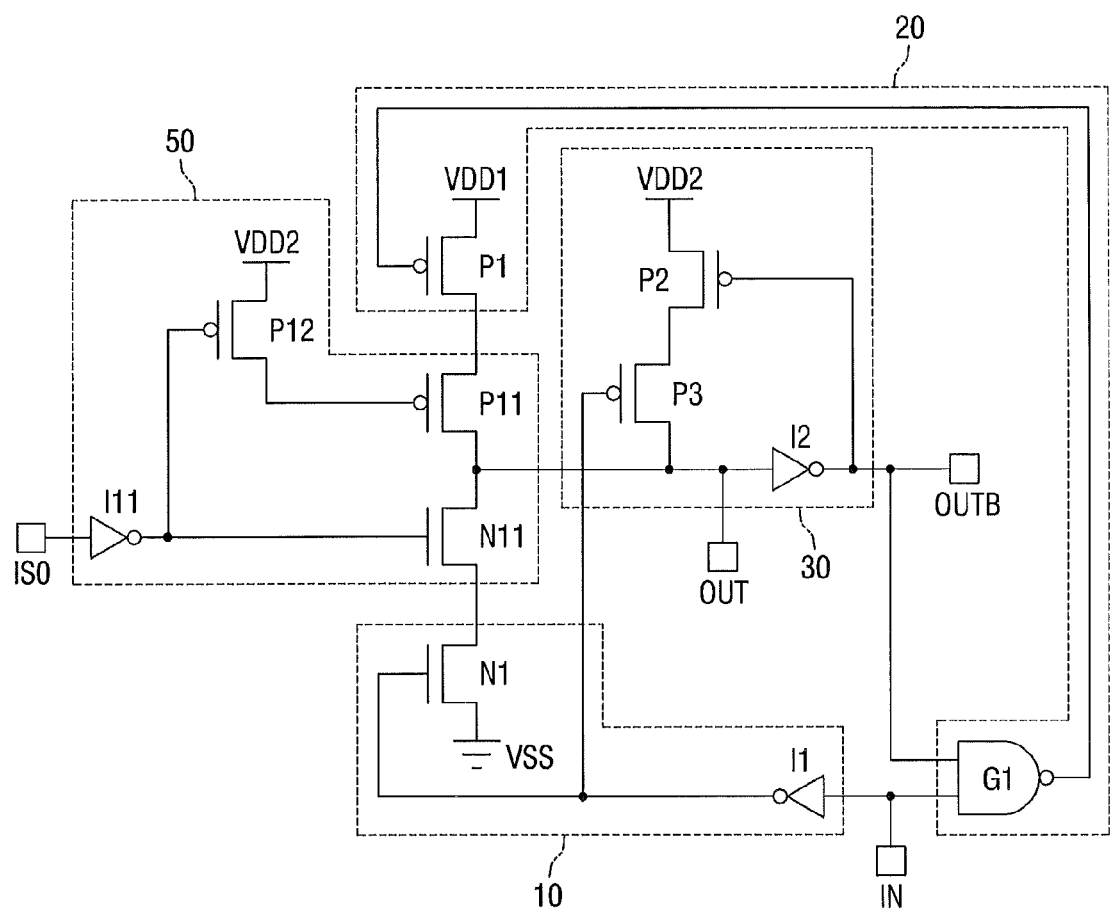
FIG. 15 is a circuit diagram of a semiconductor circuit according to still another embodiment of the present invention.

Referring to FIG. 15, the semiconductor circuit 4 may further include a clamp circuit 50 as compared with the semiconductor circuit 1 illustrated in FIG. 1. The clamp circuit 50 may include eleventh and twelfth PMOS transistors P11 and P12, an eleventh NMOS transistor N11, and an eleventh inverter I11.

The eleventh inverter I11 may invert and output a voltage level of an isolation node ISO.

The eleventh PMOS transistor P11 is gated by the output of the twelfth PMOS transistor P12 and may be connected in series with the first PMOS transistor P1 between the second voltage VDD1 and the output node OUT. The eleventh NMOS transistor N11 is gated by the output of the eleventh inverter I11 and may be connected in series with the first NMOS transistor N1 between the first voltage VSS and the output node OUT. The twelfth PMOS transistor P12 is gated by the output of the eleventh inverter I11 to transfer the third voltage VDD2 to the eleventh PMOS transistor P11.

In the semiconductor circuit 4, after section D of FIG. 2, when the voltage level of the isolation node ISO is changed from the low level to the high level, the voltage level of the output node OUT may be maintained at the high level regardless of the voltage level at the input node IN. In other words, by supplying a high voltage to the isolation node ISO the output node OUT may be clamped to a high voltage level.

Hereinafter, a semiconductor circuit 5 according to still further embodiments of the present invention will be described with reference to FIG. 16. The description of the semiconductor circuit 4 that follows will omit description of elements and the operation thereof that have already been described above with reference to other embodiments.

Figure 16:
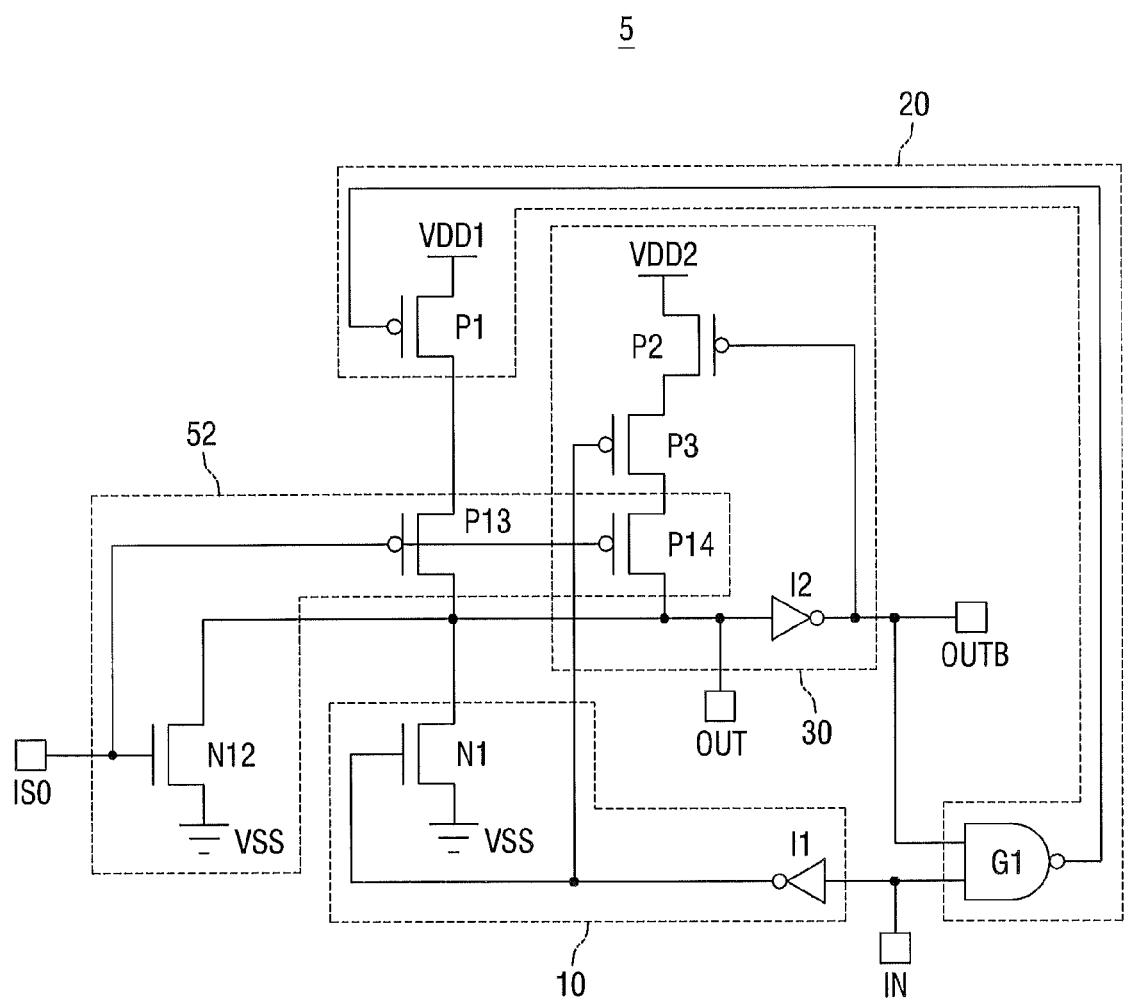
FIG. 16 is a circuit diagram of a semiconductor circuit according to a further embodiment of the present invention.

Referring to FIG. 16, the semiconductor circuit 5 may further include a clamp circuit 52 as compared with the semiconductor circuit 1 illustrated in FIG. 1. The clamp circuit 52 may include thirteenth and fourteenth PMOS transistors P13 and P14, and a twelfth NMOS transistor N12.

The thirteenth PMOS transistor P13 is gated by the voltage level of the isolation node ISO and may be connected in series with the first PMOS transistor P1 between the second voltage VDD1 and the output node OUT. The fourteenth PMOS transistor P14 is gated by the voltage level of the isolation node ISO and may be connected in series with the second and third PMOS transistors P2 and P3 between the third voltage VDD2 and the output node OUT. The twelfth NMOS transistor P12 is gated by the voltage level of the isolation node ISO to provide the first voltage VSS to the output node OUT.

In the semiconductor circuit 5, after section D of FIG. 2, when the voltage level of the isolation node ISO is changed from the low level to the high level, the voltage level of the output node OUT may be maintained to the low level regardless of the voltage level of the input node IN. In other words, the output node OUT may be clamped to a low level.

Next, an exemplary electronic system which may adopt the semiconductor device according to the embodiments of the present invention will be described with reference to FIG. 17.

Figure 17:
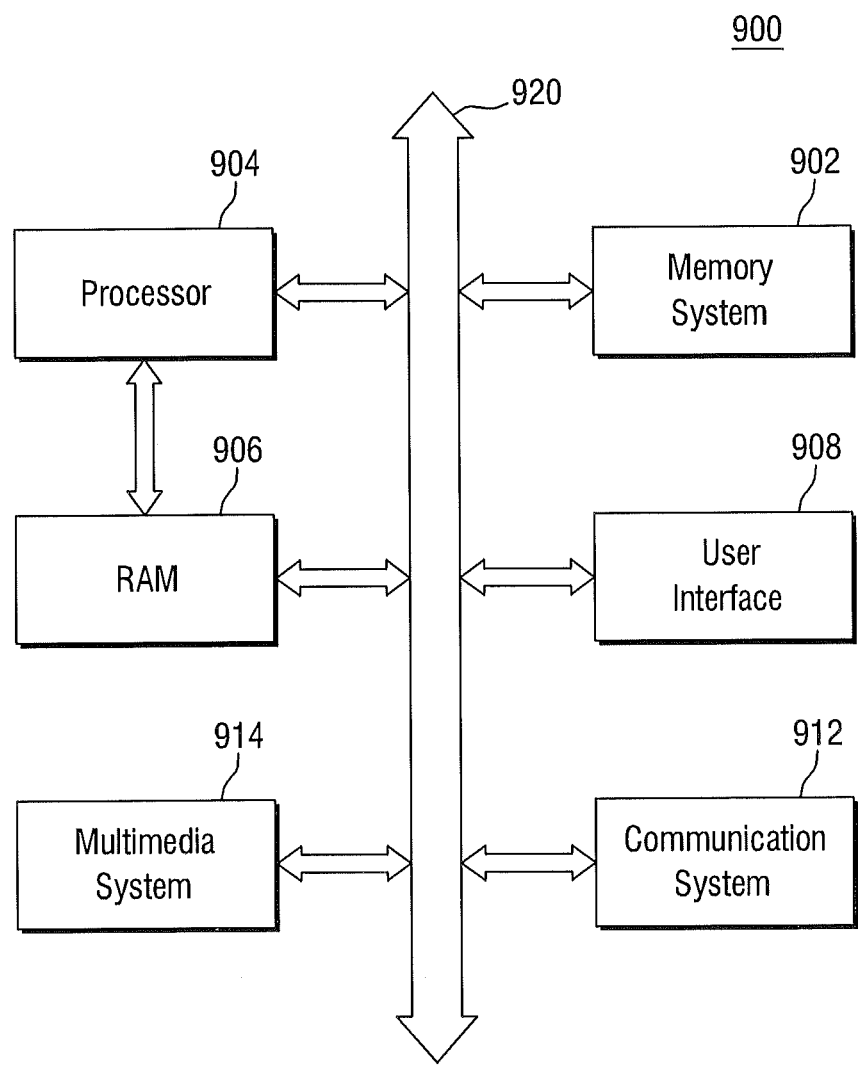
FIG. 17 is a block diagram illustrating a configuration of an exemplary electronic system that may include one or more semiconductor circuits according to embodiments of the present invention.

FIG. 17 is a block diagram illustrating a configuration of an exemplary electronic system adopting the semiconductor circuit according to the embodiments of the present invention.

Referring to FIG. 17, an electronic system 900 may include a memory system 902, a processor 904, a RAM 906, a user interface 908, a communication system 912, and a multimedia system 914.

The memory system 902, the processor 904, the RAM 906, the user interface 908, the communication system 912, and the multimedia system 914 may perform data-communication with each other by using, for example, a bus 920. In some embodiments of the present invention, the bus 920 may be, for example, a multi-layer bus, but the present invention is not limited thereto.

The processor 904 may serve to execute a program and control the electronic system 900. The processor 904 may include at least one microprocessor, a digital signal processor, a microcontroller, and/or at least one of logic elements that may perform similar functions thereto. In some embodiments of the present invention, the processor 904 may include operating caches such as an L1 and an L2 in order to improve an operating speed.

The RAM 906 may be used as an operating memory of the processor 904. The RAM 906 may be formed by, for example, a volatile memory such as a DRAM.

Meanwhile, the processor 904 and the RAM 906 may be implemented by one semiconductor device or by being packaged as a semiconductor package. In some embodiments of the present invention, the processor 904 and the RAM 906 may be implemented by being packaged in a package on package (PoP) form, but the present invention is not limited thereto.

The user interface 908 may be used to input data to or output data from the electronic system 900. Examples of the user interface 908 may include a keypad, a keyboard, a touch sensor, and a display device. Each user interface 908 may be implemented as an independent system in the electronic system 900. For example, the keypad, the keyboard, and the touch sensor may be implemented as an input system and the display device may be implemented as a display system. Meanwhile, the display system may include a data driving IC (DDIC) for driving the display device, and the like.

The memory system 902 may include one or more non-volatile memory devices for storing a code for an operation of the processor 904, data processed by the processor 904, or data input from the outside. The memory system 902 may include a separate controller. The memory system controller may be configured to connect a host and the non-volatile memory device. The controller may be configured to access the non-volatile memory device in response to a request from the host. For example, the controller may be configured to control reading, writing, erasing, and background operations of the non-volatile memory device. The memory system controller may be configured to provide an interface between the non-volatile memory device and the host. Further, the memory system controller may be configured to drive firmware for controlling the non-volatile memory device.

For example, the memory system controller may further include well-known components, such as a random access memory (RAM), a processing unit, a host interface, and a memory interface. The RAM may be used as at least one among an operating memory of the processing unit, a cache memory between the non-volatile memory device and the host, and a buffer memory between the non-volatile memory device and the host. The processing unit may control all operations of the controller.

The host interface may include a protocol for exchanging data between the host and the controller. For example, the controller may be configured to communicate with the outside (host) through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol. The memory interface may interface with the non-volatile memory device. For example, the memory interface may include a NAND interface or a NOR interface.

The memory system 902 may be configured to additionally include an error correction block. The error correction block may be configured to detect and correct an error of data stored the memory system 902 by using an error correction code (ECC). For example, the error correction block may be provided as a component of the aforementioned controller. However, the present invention is not limited thereto and the error correction block may be provided as a component of the non-volatile memory device.

Meanwhile, in an information processing system such as a mobile apparatus or a desktop computer, a flash memory which is one example of the non-volatile memory may be used as the memory system 902. The flash memory may be configured in a form of a solid state drive (SSD). In this case, the electronic system 900 may stably store large-capacity data in the flash memory.

The memory system 902 may be integrated in one semiconductor device. For example, the memory system 902 is integrated in one semiconductor device to configure a memory card. For example, the memory system 902 may be integrated in one semiconductor device to configure a memory card, such as a PC card (personal computer memory card international association (PCMCIA)), a compact flash (CF) card, smart media cards (SM, SMC), a memory stick, a multimedia card (MMC, RS-MMC, and MMCmicro), an SD card (SD, miniSD, microSD, and SDHC), and a universal flash storage (UFS).

For example, the memory system 902 may be installed as various types of packages. For example, the memory system 902 may be packaged by a method, such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi chip package (MCP), wafer-level fabricated package (WFP), and wafer-level processed stack package (WSP).

The communication system 912 may be a system that executes a communication process between the electrode system 900 and the outside. The multimedia system 914 may be a system that performs various types of multimedia processing in the electronic system 900. The multimedia system 914 may include, for example, a graphic engine, a video codec, a camera module, and the like.

The semiconductor circuits 1 to 5 according to the aforementioned embodiments of the present invention may be used to provide different voltages to the aforementioned various systems and modules. For example, the semiconductor circuits 1 to 5 may be used to provide different voltages to the processor 904 and the memory system 902 from one voltage source (for example, a battery), and may be used to provide different voltages to the communication system 912 and the multimedia system 914.

Figure 18:
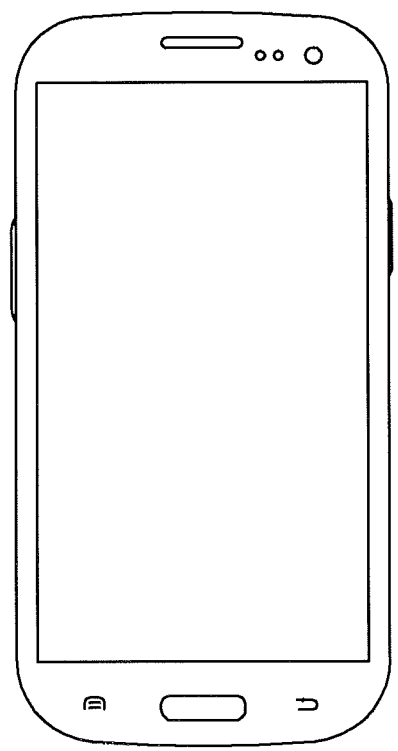
FIG. 18 is a diagram illustrating an example in which the electronic system of FIG. 17 is applied to a smart phone.

The electronic system 900 illustrated in FIG. 17 may be applied to electronic control devices of various electronic apparatuses. FIG. 18 is a diagram illustrating an example in which the electronic system 900 of FIG. 17 is applied to a smart phone 1000. When the electronic system 900 of FIG. 17 is applied to the smart phone 1000, the electronic system 900 of FIG. 17 or a part of the electronic system 900 of FIG. 17 may be an application processor (AP) implemented in a form of a system on chip (SoC).

Figure 19:
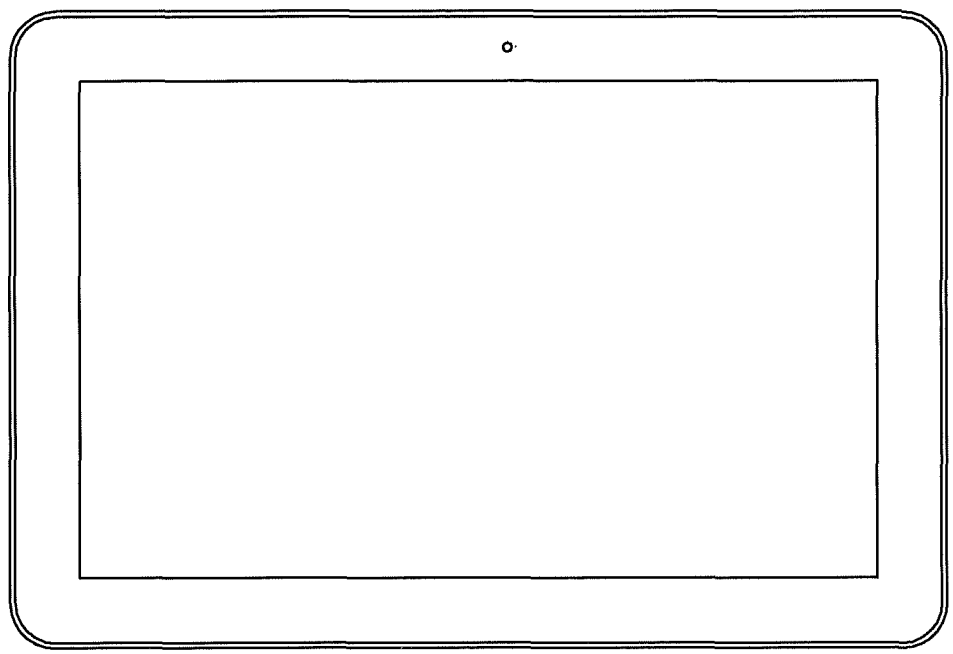
FIG. 19 is a diagram illustrating an example in which the electronic system of FIG. 17 is applied to a tablet PC.
Figure 20:
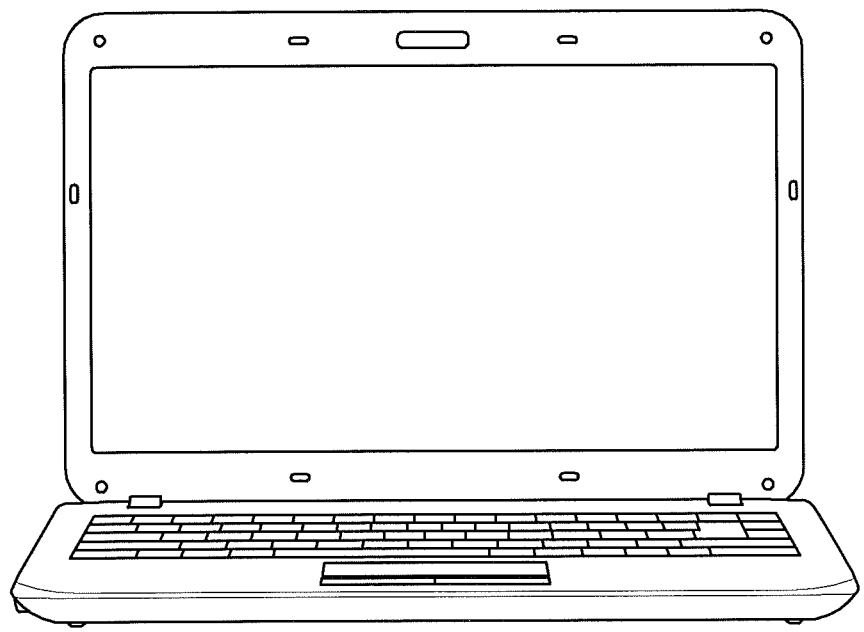
FIG. 20 is a diagram illustrating an example in which the electronic system of FIG. 17 is applied to a notebook PC.

The electronic system 900 of FIG. 17 may be adopted in various other electronic apparatuses. FIG. 19 is a diagram illustrating an example in which the electronic system 900 of FIG. 17 is applied to a tablet PC 1100. FIG. 20 is a diagram illustrating an example in which the electronic system 900 of FIG. 17 is applied to a notebook 1200.

The electronic system 900 of FIG. 17 may be provided as one of various constituent elements of an electronic device, such as a personal computer, an ultra mobile PC (UMPC), a workstation, a net-book computer, personal digital assistants (PDA), a portable computer, a web tablet PC, a wireless phone, a mobile phone, an e-book reader, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or one of various constituent elements configuring a computing system.

When the electronic system 900 of FIG. 17 is equipment that may perform wireless communications, the electronic system 900 of FIG. 17 may be used in a communication system such as a code division multiple access (CDMA), a global system for mobile communication (GSM), a north American digital cellular (NADC), an enhanced-time division multiple access (E-TDMA), a wideband code division multiple access (WCDMA), and a CDMA2000.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A semiconductor circuit, comprising:
   a first circuit configured to provide a first voltage to an output node when a voltage level of an input node is at a first level;
   a second circuit configured to provide a second voltage to the output node when the voltage level of the input node is at a second level; and
   a third circuit configured to provide a third voltage to the output node in response to the second voltage being provided to the output node,
   wherein the second circuit is configured to not provide the second voltage to the output node when the third voltage is provided to the output node.

2. The semiconductor circuit of claim 1, wherein the third circuit includes:
   a first transistor gated by an inverse of the voltage level of the output node; and
   a second transistor gated by the voltage level of the input node or by the inverse of the voltage level of the input node.

3. The semiconductor circuit of claim 2, wherein the first and second transistors are connected in series between the third voltage and the output node.

4. The semiconductor circuit of claim 1, wherein the second circuit includes a logic operation element that logically operates on an inverted voltage level of the output node and the voltage level of the input node.

5. The semiconductor circuit of claim 4, wherein the second circuit further includes a transistor that is gated by an output of the logic operation element to provide the second voltage to the output node.

6. The semiconductor circuit of claim 4, wherein the second circuit comprises a NAND gate.

7. The semiconductor circuit of claim 6, wherein the first level includes a low level, and the second level includes a high level.

8. The semiconductor circuit of claim 4, wherein the second circuit comprises a NOR gate, and wherein the first level includes a high level, and the second level includes a low level.

9. The semiconductor circuit of claim 1, wherein the first circuit includes:
   an inverter configured to invert the voltage level of the input node; and
   a transistor gated by an output of the inverter to provide the first voltage to the output node.

10. The semiconductor circuit of claim 1, wherein an absolute value of a magnitude of the third voltage is larger than an absolute value of a magnitude of the second voltage.

11. The semiconductor circuit of claim 1, wherein the semiconductor circuit is a level shifter.

12. A semiconductor circuit, comprising:
    an input node;
    an output node;
    a first supply voltage that is selectively supplied to the output node;
    a second supply voltage that is selectively supplied to the output node; and
    a third supply voltage that is selectively supplied to the output node;
    wherein the semiconductor circuit is configured so that transition of a voltage level input at the input node from a first level to a second level selectively supplies the second supply voltage to the output node, and thereafter supplies the third supply voltage to the output node, and wherein the semiconductor circuit is further configured to cease supplying the second supply voltage to the output node in response to the third supply voltage being supplied to the output node, and wherein the third supply voltage is coupled to the output node by a first transistor and a second transistor that are coupled in series and gated by different nodes of the semiconductor circuit.

13. The semiconductor circuit of claim 12, wherein the semiconductor circuit is configured so that transition of the voltage level input at the input node from the second level to the first level selectively supplies the first supply voltage to the output node, and wherein the semiconductor circuit is configured so that transition of the voltage level input at the input node from the second level to the first level further ceases supply of the third supply voltage to the output node.

14. The semiconductor circuit of claim 12, wherein an absolute value of a magnitude of the third supply voltage is larger than an absolute value of a magnitude of the second supply voltage.

15. The semiconductor circuit of claim 12, further comprising a clamp circuit that is configured to clamp a voltage level of the output node at the third supply voltage when the voltage level input to the input node is at either the first level or the second level.

16. The semiconductor circuit of claim 13, wherein the third supply voltage is supplied to the output node once the supply of the second supply voltage to the output node raises a voltage at the output node sufficiently so that a switch is turned on that supplies the third supply voltage to the output node.

17. The semiconductor circuit of claim 12, wherein the first transistor is gated by an inverse of the voltage level of the output node and the second transistor is gated by the voltage level of the input node or by the inverse of the voltage level of the input node.

* * * * *